(12) United States Patent
Wunnicke (10) Patent No.: US 8,120,003 B2
(45) Date of Patent: Feb. 21, 2012

(54) NANOWIRE MAGNETIC RANDOM ACCESS MEMORY

(75) Inventor: Olaf Wunnicke, Eindhoven (NL)

(73) Assignee: NXP B.V., Eindhoven (NL)

( * ) Notice: Subject to any disclaimer, the term of this patent is extended or adjusted under 35 U.S.C. 154(b) by 413 days.

(21) Appl. No.: 12/088,724

(22) PCT Filed: Sep. 22, 2006

(86) PCT No.: PCT/IB2006/053439
§ 371 (c)(1),
(2), (4) Date: Mar. 31, 2008

(87) PCT Pub. No.: WO2007/036860
PCT Pub. Date: Apr. 5, 2007

(65) Prior Publication Data
US 2008/0251867 A1    Oct. 16, 2008

(30) Foreign Application Priority Data
Sep. 30, 2005    (EP) .................................. 05109047

(51) Int. Cl.
*H01L 27/20* (2006.01)
(52) U.S. Cl. ............. 257/3; 257/2; 257/4; 257/5; 257/9; 257/E21.665
(58) Field of Classification Search .................. 257/2–5, 257/9, E21.665
See application file for complete search history.

(56) References Cited

U.S. PATENT DOCUMENTS

| | | | |
|---|---|---|---|
| 2004/0061156 A1* | 4/2004 | Cha | 257/295 |
| 2004/0165425 A1* | 8/2004 | Nakamura et al. | 365/171 |
| 2004/0257894 A1 | 12/2004 | Onogi et al. | |
| 2005/0041462 A1 | 2/2005 | Kent et al. | |
| 2005/0117389 A1* | 6/2005 | Worledge | 365/171 |
| 2005/0117392 A1* | 6/2005 | Hayakawa et al. | 365/171 |

FOREIGN PATENT DOCUMENTS

| | | |
|---|---|---|
| EP | 1109169 A2 | 6/2001 |
| JP | 2004146821 A | 5/2004 |

OTHER PUBLICATIONS

Chiba (Phys. Rev. Lett. 93, pp. 216602 1-4), Current-Driven Magnetization Reversal in a Ferromagnetic Semiconductor (Ga, Mn)As/GaAs/(Ga, Mn)As Tunnel Junction.*
Han, Doo Suk; et al "Ferromagnetic MN-Doped GaN Nanowires for Nanospintronics" Applied Physics Letters 86, 032506, Jan. 10, 2005.
Wolf, S. A; et al "Spintronics: A Spin-Based Electronics Vision for the Future" Sciencemag, Science, vol. 294, Nov. 16, 2001, pp. 1488-1494.

(Continued)

*Primary Examiner* — Minchul Yang (57) ABSTRACT

An integrated array of non volatile magnetic memory devices, each having a first magnetic layer (10) with a fixed magnetization direction; a free magnetic layer (20) with a changeable magnetization direction; a spacer layer (30) separating the first magnetic layer and the free magnetic layer, and a switch (40) for selecting the device, the layers and at least part of the switch being formed as a columnar structure such as a nanowire. The switch is preferably formed integrally with the columnar nano-structure. By incorporating the switch in the columnar structure with the magnetic layers, the device can be made smaller to enable greater integration. This can be applied to magnetic devices using external fields or those using only fields generated in the columnar structure. A write current can be coupled along the columnar structure in a forward or reverse direction to alter the direction of magnetization of the free magnetic layer according to the direction of the current.

23 Claims, 9 Drawing Sheets

OTHER PUBLICATIONS

Chang, Kai, Xia, Jiarr- Bai. "Diluted Magnetic Semiconductors- Bridging Spin and Charge." Jun. 30, 2004. 5pp. (English Abstract Included).

Yan, Chong et al. "Development in Spintronics." February 28, 2005. 7pp. (English Abstract included.).
"Study in Spintronics." Infrared (Monthly/Mar. 2004). 4pp. (Only in Chinese).

* cited by examiner

FIG. 9 substrate + electrode

FIG. 10 epitaxial growth of NWs

FIG. 11 gate dielectric + filling of voids with e.g. PMMA

FIG. 12 gate contacts

FIG. 13

NANOWIRE MAGNETIC RANDOM ACCESS MEMORY

This invention relates to magnetic devices, to integrated arrays of such devices, particularly for memories, and to methods of manufacturing such devices.

Magnetic devices that use a flow of spin-polarized electrons are known for magnetic non volatile memory. Such a device generally includes at least two ferromagnetic electrodes that are separated by a non-magnetic material, such as a metal or insulator. The thicknesses of the electrodes are typically in the range of 1 nm to 50 nm. The resistance of the device depends on the relative magnetization orientation of the magnetic electrodes, such as whether they are oriented parallel or anti-parallel (i.e., the magnetizations lie on parallel lines but point in opposite directions). One electrode typically has its magnetization pinned, i.e., it has a higher coercivity than the other electrode and requires larger magnetic fields or spin-polarized currents to change the orientation of its magnetization. The second layer is known as the free layer and its magnetization direction can be changed relative to the former, to store a "1" or a "0" The device resistance will be different for these two states and thus the device resistance can be used to read the state and distinguish "1" from "0." In conventional magnetic random access memory (MRAM) designs, magnetic fields are used to switch the magnetization direction of the free layer, using current carrying wires located near the magnetic layers. Cross-talk will limit the density of the memory and/or cause errors in memory operations. Further, the magnetic fields generated by such wires are limited to about 0.1 Tesla at the position of the electrodes, which leads to slow device operation.

It is also known to use a spin-polarized current through the free layer to directly change its magnetic orientation. As described in US patent application 2005/0041462, the spin angular momentum of the flowing electrons interacts directly with the background magnetization of a magnetic region. The moving electrons transfer a portion of their spin-angular momentum to the background magnetization and produce a torque on the magnetization in this region to alter the direction of magnetization. Conventionally the preferred axes of the magnetic layers are all "vertical" (i.e., in the same direction or orientation). This patent application suggests using layer magnetizations that are not parallel to the same axis, to improve speed, reliability, and power consumption. Columnar stacks of magnetic layers are used, with widths down to 200 nm. A current pulse in one direction through the stack serves to rotate the magnetization by 180 degrees and change the state. Another current pulse in the same direction serves to rotate by another 180 degrees and thus change the state back.

So the two current pulses are used to change the magnetization direction to increase the writing speed: a first pulse to start the rotation of the magnetization direction and a stop pulse in the other direction to stop the rotation. By this means the precession time of the magnetization direction is reduced.

The high critical current density needed to switch the magnetization direction for metallic ferromagnets is reported to be a difficult issue. In metallic ferromagnets the critical current for magnetization reversal is around $10^7 \ldots 10^8$ A/cm$^2$. This current density is too high for many materials used in integrated circuits, such as metals. A high current density means also a high power consumption.

It is known from US patent application 2004 0257894 to provide a field effect magnetic spin controlled device for writing an MRAM by electric field carrier doping. The device uses diluted magnetic semiconductor (DMS) materials. The DMS regions are switched by an electric field of a FET.

It is known from Applied Physics Letters 86, 032506 (2005) to provide ferromagnetic Mn-doped GaN nanowires. The diluted magnetic semiconductor (DMS) is here a 5% Mn-doped GaN semiconductor. GaN nanowires doped with 5% Mn have been manufactured by chemical vapor deposition using the reaction of Ga/GaN/MnCl$_2$ with NH$_3$. The diameter of the nanowires is 40-70 nm. The 5% Mn-doped GaN nanowires exhibit room temperature ferromagnetism.

An object of the invention is to provide improved magnetic devices, and/or integrated arrays of such devices, particularly for memories, and/or methods of manufacturing such devices. According to a first aspect, the invention provides:

A magnetic device comprising: a first magnetic layer with a fixed magnetization direction; a free magnetic layer with a changeable magnetization direction; a spacer layer separating the first magnetic layer and the free magnetic layer, and a selection device such as a switch for selecting the magnetic device, the layers and at least part of the selection device, e.g. the switch, being formed as a columnar structure. The switch is formed integrally with the columnar structure. Preferably the columnar structure is a nano-structure. The nano-structure can be a nanowire or nanotube or similar.

By incorporating the selection device, e.g. a switch in with the columnar structure and the magnetic layers, the magnetic device can be made smaller to enable greater integration or lower manufacturing costs. The integration can also improve writing speed and allows a high memory density. No additional area is required for the selection device as it is incorporated in the columnar structure. Stray fields are reduced as writing currents are low. However, due to the use of a nano-structure current densities are high.

The present invention can be applied to magnetic devices using external fields or those using only fields generated on the magnetic device, e.g. in the columnar structure. The present invention can also be applied to spintronic devices.

The magnetic device can be arranged as a memory and having circuitry arranged to couple a current along the columnar structure with sufficient spin polarized current density to alter the direction of magnetization of the free magnetic layer.

The current along the columnar structure can be in a forward or reverse direction for writing the memory with a value according to the direction of the current.

This enables the device to be written or switched without an external field and without needing to set levels of writing currents to vary the state. Thus the device can be simpler and easier to manufacture, and more compact. Power consumption can be lower for reading and writing by using the current induced magnetization reversal for the writing process. The reversal can be performed rapidly, e.g. within hundreds of picoseconds. Stray fields are reduced as writing currents are low.

One or more of the magnetic layers can comprise diluted magnetic semiconductor materials (DMS). Forming the layers as a columnar structure and using DMS material helps enable the spin polarized current density to achieve the desired level so that an external field is not needed to alter the direction.

It is an advantage of the present invention that the memory cell and the selection device may be grown in one step, e.g. epitaxially. During this processing the required impurity atoms can be introduced, e.g. an n- or p-dopant for a selection device and magnetic impurities such as Mn, Co, Fe for the memory cell, without requiring heterostructures. The semiconductor material can be for instance GaN, GaA sor InN.

The thickness of the spacer layer of the magnetic device is arranged such that the free magnetic layer is within a spin flip length of majority carriers of the first magnetic layer. It is a big advantage that the spin flip length in DMS materials is much larger than in metals.

The spacer layer should be thicker than the magnetic coupling length (such as the interlayer exchange coupling and other magnetic couplings, e.g., the Peel coupling) between the first magnetic layer and the free layer, because the free layer should be able to rotate. The magnetic coupling between DMS layers is weaker than for ferromagnetic or ferrimagnetic metals.

Preferably the columnar structure including the DMS layers is an n-type doped semiconductor layer-structure. The columnar nano-structure and the DMS regions are preferably n-doped because electrons have a longer spin-flip length than holes. But generally speaking also holes can be used. The spin of an electron can be carried without dephasing over distances as long as 100 micrometer.

Another aspect provides an integrated array of such devices.

Another aspect of the invention provides a second magnetic layer with a fixed magnetization direction in a different direction to that of the first magnetic layer.

The columnar structure can comprise two regions of different thicknesses, which are doped by magnetic atoms so that these regions transform into a diluted magnetic semiconductor (DMS). The thinner DMS region is the free layer which functions as a memory cell and stores the information within the direction of the magnetization. The thicker DMS region is the first layer which is used to write the information, i.e., to rotate the magnetization direction of the thin DMS region, by means of current induced magnetization reversal. Applying a small voltage and measuring the current through the columnar structure performs the read-out of the information, i.e., the magnetization direction. The magnitude of the current depends on the relative magnetization direction of both DMS regions. In case of parallel alignment the current is higher than for antiparallel alignment because the electronic states are identical in both DMS regions. In the antiparallel alignment an electron with "spin up" detects the electronic states for "spin down" electrons in the other DMS region and so the current is reduced. A spin-polarized current can reverse the magnetization direction in a DMS region if the current density is higher than a critical current density that typical lies in the order of $10^5$-$10^7$ A/cm$^2$.

Preferably at least part of the columnar structure is tubular.

In an integrated memory array having a substrate, the columnar structures are arranged perpendicular to the substrate.

The array has a first select line coupling the switches of the devices in a row of the array, and a second select line for coupling a top or bottom of the columnar structure of devices in different rows.

The invention further relates to a method of manufacturing the array of magnetic devices comprising epitaxial growth of the magnetic layers on a substrate to form the columnar structures.

On an aribitrary conducting substrate, columnar structures such as semiconducting nanowires (SC-NW) or nanotubes with a diameter of about 20-100 nm and with a length of several 100 nanometers up to several micrometers are grown epitaxially. The growth of such nanowires can be performed, e.g., by the VLS growth. But also other growth techniques may be applicable, e.g., standard lithography and etching. The epitaxy is needed to ensure perpendicular growth and a good electrical contact but is not essential for the working principle of the memory device. A good crystallinity is needed because the spin transport and all spin-dependent scattering events, i.e., the spin-dependent transport, happen inside the nanowire or nanotube. The columnar structure comprises two regions, which are doped by ferromagnetic atoms to create a diluted magnetic semiconductor (DMS). This can be achieved for example by doping GaN with a few atomic percent of Mn resulting in $(Ga_{1-x}Mn_x)N$. But there are also other possible combinations. The nanowire and the DMS regions are preferably n-doped because electrons have a longer spin-flip length than holes. But generally speaking also holes can be used.

The spin of an electron can be carried without dephasing over distances as long as 100 micrometer. DMS nanowires are grown with Curie temperatures above room temperature. It is important that both DMS regions have different thicknesses so that the thicker region does not change its magnetization direction. The separation of both regions is preferably larger than the interlayer exchange coupling and other magnetic couplings, e.g., the Peel coupling. This assures a free rotation of the thin DMS region. But at the same time the distance should be smaller than the spin-flip length of the majority carriers. This ensures that the spin-polarized current from the one DMS region reaches the other DMS region to change its magnetization direction. The thinner DMS region acts as the memory cell, which stores the information by its magnetization direction.

The integration of an access (field-effect-)transistor in the columnar structure is advantageous, because no additional area is needed for the access transistor. This means that the access transistor does not limit the scalability. The access transistor can be placed above or below the active device.

The method further comprises forming a gate dielectric around each columnar structure.

A filler around each columnar structure is formed up to the channel, and forming a gate electrode for each columnar structure on the filler around the gate dielectric.

By depositing a gate dielectric between the semiconductor columnar structure and the metallic gate electrode, the electrons in n-doped semiconductor columnar structure can be depleted by applying a negative gate voltage. This will reduce the current through the semiconductor columnar structure by several orders of magnitude and thus the reading and writing process can be controlled. Furthermore, the surrounded gate field-effect-transistor is capable of the high switching frequencies in the order of several gigahertz. The access-transistor is not necessarily a FET, but can be a bipolar transistor or another type of transistor. A bipolar transistor can be manufactured within the semiconductor nanowire by a dopant profile above or below the active device in the order n-p-n or p-n-p. By contacting the middle base region, the current through the nanowire can be controlled by the voltage at this connection.

The method further comprises forming a second magnetic layer as a line on top of a number of the columnar structures to form a second select line.

Other aspects of the invention include methods of manufacturing such devices or arrays of such devices.

Additional features and advantages are described below. Any of the additional features can be combined together and combined with any of the aspects. Other advantages will be apparent to those skilled in the art, especially over other prior art. Numerous variations and modifications can be made without departing from the claims of the present invention. Therefore, it should be clearly understood that the form of the present invention is illustrative only and is not intended to limit the scope of the present invention.

How the present invention may be put into effect will now be described by way of example with reference to the appended drawings, in which.

The present invention will be described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes. Where the term "comprising" is used in the present description and claims, it does not exclude other elements or steps. Where an indefinite or definite article is used when referring to a singular noun e.g. "a" or "an", "the", this includes a plural of that noun unless something else is specifically stated.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Embodiments described show a new memory concept: a nanowire or nanotube magnetic-random-access-memory (NW-MRAM). The embodiments can be applied in the new field of microelectronics called magneto- or spin electronics [see Prinz, Science 282, 1660 (1998); Wolf et al., Science 294, 1488 (2001).]. Embodiments exploit a combination of the charge of the electron that is used widely in microelectronics with the spin of the electron that is used for information storage as in hard disks. Although shown for use as a memory, other applications such as switching and sensing are included within the scope of the present invention.

In preferred embodiments a selection device and a memory device are grown in a single columnar structure such as a nanowire. The term "columnar nano-structure" is intended to encompass a wide range of elongate geometric shapes including wires or tubes and other shapes which can provide the necessary current density.

Additional features include the following: the selection device can comprise a switch, e.g. it can comprise transistor such as a field effect transistor, bipolar transistor or other transistor, which is grown integrally with the columnar nanostructure. The part of the switch comprising a channel of the transistor can be located at one end of the columnar structure. The transistor can have a gate dielectric layer adjacent to or surrounding the columnar structure. The transistor can have a gate electrode adjacent to or around the channel and be separated by the gate dielectric. One or more of the magnetic layers can comprise diluted magnetic semiconductor material DMS. During this processing the required impurity atoms can be introduced, e.g. an n- or p-dopant for a selection device and magnetic impurities such as Mn, Co, Fe for the memory cell, without requiring heterostructures. The semiconductor material can be for instance GaN, GaAs or InN.

The magnetic impurities are thin ferromagnetic disks which form a single ferromagnetic domain. The magnetization direction of this single ferromagnetic domain can be switched within less than 200 picoseconds resulting in a writing speed of more than one gigahertz. Furthermore, they have only small stray fields due to the vortex state of the magnetization pattern. Together with the absence of large magnetic fields to rotate the magnetization direction, this leads to a good scalability of nanowire (NW)-MRAMs.

The thickness of the spacer can be arranged such that the free magnetic layer is within a spin flip length of majority carriers of the first magnetic layer. A second magnetic layer can be provided with a fixed magnetization direction in a different direction to that of the first magnetic layer.

The magnetic device can be arranged as a memory having additional circuitry arranged to couple a current along the columnar structure with sufficient spin polarized current density to alter the direction of magnetization of the free magnetic layer. The current can be coupled along the columnar structure in a forward or reverse direction for writing the memory with a value according to the direction of the current. At least part of the columnar structure can be tubular. The columnar structure preferably has nanometric dimensions, e.g. the width of the columnar structure is preferably in the range 10 to 100 nm, preferably 10-40 nm.

An integrated memory array can have a substrate and an array of the above magnetic devices. The columnar structures of the devices can be arranged perpendicular to a planar substrate. A first select line can couple the selection devices, e.g. switches, of the magnetic devices in a row of the array, and a second select line can couple a top or bottom of the columnar structure of magnetic devices in different rows.

The method of manufacturing the array can have the step of epitaxial growth of the magnetic layers on a substrate to form the columnar structures, and the step of forming a gate dielectric around each columnar structure. The substrate may be selected from any suitable semiconductor substrate.

In embodiments of the present invention, the term "substrate" may include any underlying material or materials that may be used, or upon which a device, a circuit or an epitaxial layer may be formed. In other alternative embodiments, this "substrate" may include a semiconductor substrate such as e.g. doped silicon, a gallium arsenide (GaAs), a gallium arsenide phosphide (GaAsP), an indium phosphide (InP), a germanium (Ge), or a silicon germanium (SiGe) substrate. The "substrate" may include for example, an insulating layer such as a $SiO_2$ or a $Si_3N_4$ layer in addition to a semiconductor substrate portion. Thus, the term substrate also includes silicon-on-glass, silicon-on sapphire substrates. The term "substrate" is thus used to define generally the elements for layers that underlie a layer or portions of interest. Also, the "substrate" may be any other base on which a layer is formed, for example a glass or metal layer.

A filler can be formed between each columnar structure layer up to the gate region, and a gate electrode for each columnar structure can be formed on the filler around the gate dielectric. A second magnetic layer can be formed as a line on top of a number of the columnar structures to form a second select line.

In accordance with an embodiment, the magnetic memory device can have a columnar structure in the form of a semiconducting nanowire grown perpendicularly on a bottom electrode and contacted on top by a top electrode. The nanowire can have two magnetic regions of different thicknesses, which are doped by magnetic atoms so that these regions transform into a diluted magnetic semiconductor (DMS). In this embodiment, the thinner DMS region is the free layer 20 of the memory cell and stores the information within the direction of the magnetization. The thicker DMS region 10 is used to write the information, i.e. to rotate the magnetization direction of the thin DMS region, by means of current induced magnetization reversal. This means a reduced external magnetic field or no external field need to be used for writing. Applying a small voltage and measuring the current through the nanowire performs the read-out of the information, i.e., the magnetization direction. The magnitude of the current depends on the relative magnetization direction of both DMS regions. In case of parallel alignment the current is higher than for antiparallel alignment because the electronic states are identical in both DMS regions. In the antiparallel alignment an electron with "spin up" detects the electronic states for "spin down" electrons in the other DMS region and so the current is reduced.

Embodiments of the present invention can have writing speeds in the region of more than one gigahertz, are non-volatile memories, have low power consumption, and have high memory densities. Compared with the standard MRAM they can show lower power consumption, and/or reduced stray fields, and/or higher packing density. They can be used in computer memories and other applications.

The reversal of the magnetization direction is achieved by a spin-polarized current either from the thick DMS region or from a ferromagnetic top-electrode. The read-out is performed by applying a small voltage and measuring the current. This current depends on the magnetization direction of the thin DMS region relative to the one of the thicker DMS region. This can be understood by a spin-dependent transmission probability through both DMS regions due to different electronic states in case of an antiparallel alignment of the magnetic moments. This contrasts to conventional MRAMs, in which the reversal of the magnetization direction of a thin ferromagnetic pattern is performed by forcing a high current through the bit- and the wordline and using the resulting magnetic field to reverse the magnetization direction. Due to the high current for writing of a MRAM cell the power consumptions is high and due to the stray fields around the current lines the memory density is limited or sophisticated shielding of the stray fields is necessary. The NW-MRAM can address these drawbacks.

The writing process of the information is obtained by a spin-polarized current through the relevant ferromagnetic layer. The spin of the electrons forming this current acts as a torque on the magnetization and if a certain current density is reached, the magnetization direction can be turned by 180 degrees. Although the current density must be high to obtain magnetization reversal, the overall current is small due to the small diameter of the nanowires. In current thin film processes such small areas in the sub-micrometer range are difficult to obtain. In contrast to this the nanowires exhibit diameters in the order of a few 10s of nanometer. Furthermore, the current induced magnetization process produces only tiny stray fields resulting in a very good scalability with large memory densities of more than one gigabyte per square inch.

The memory is notable for being non-volatile memory. Because the information is stored in the magnetization direction of a ferromagnetic layer, it is kept also when the power is switched off. This is useful for mobile phones, for personal computers for speeding up the start of the computer and for replacing hard disks. It has been shown that small single ferromagnetic domain pattern can be switched with a speed of more than one gigahertz. This results in very high writing speeds of the NW-MRAM. Also the proposed access field-effect-transistor can work at similar high frequencies.

Notably MRAMs consume relatively little power since no refresh cycles are needed to keep the information. The NW-MRAM consumes even less power since it writes the information by a spin-polarized current that needs less power than using the magnetic fields of a current.

High memory density can be achieved if the nanowires have diameters of a few 10 nanometers. Also the access field-effect-memory does not need additional space if it is included in the nanowire structure. The memory density is only limited by the resolution of the word- and bit lines. As with any magnetic memory, there is insensitivity against radioactivity and cosmic particles since the information is stored in the magnetization direction and does not rely on the build up of charges.

Figure 1:
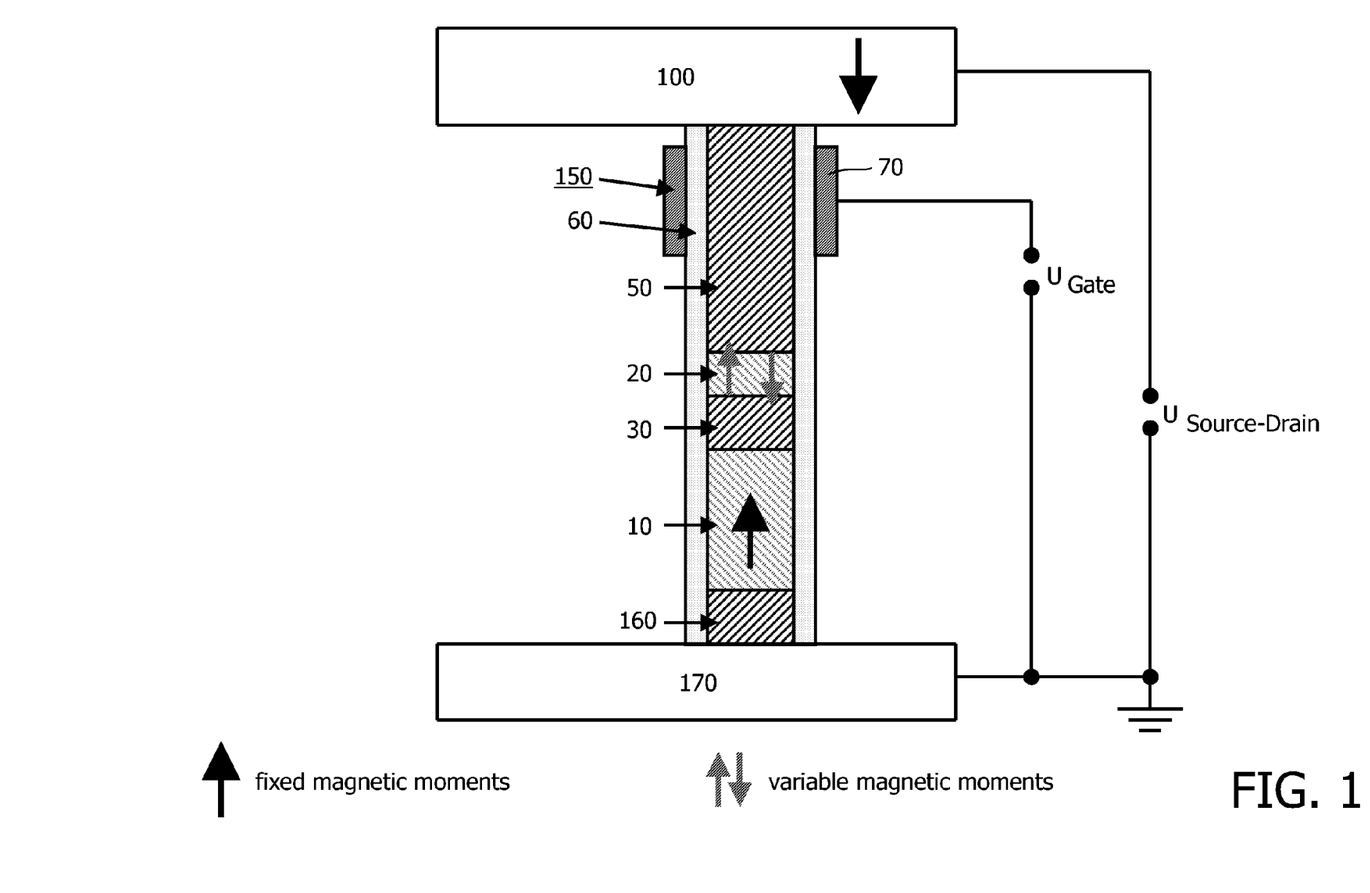
FIG. 1 shows a schematic view of an embodiment of a memory with a selection device.

Embodiment shown in FIG. 1

A first embodiment of the invention, schematically illustrated in FIG. 1 includes a nanowire structure. On an arbitrary substrate as described above (not shown), a non ferromagnetic bottom electrode 170 is provided, on which semiconducting nanowires (SC-NW) with a length in the order a few hundred nanometer are grown, e.g. epitaxially. The growth of such nanowires can be performed, e.g., by the VLS (vapor liquid solid) growth process using known techniques. Other growth techniques can be applicable. The epitaxy process is useful to ensure perpendicular growth and to reduce interface scattering and spin-flip processes. A high interface quality can lead to high spin-polarized currents in a semiconductor. As depicted in FIG. 1, the nanowire contains two magnetic regions 20 and 10 formed of a diluted magnetic semiconductor (DMS). This can be achieved by doping these parts of the semiconductor, e.g. GaN, with a magnetic impurity (e.g. Mn) with a concentration in the order of a few atomic percent (e.g. $(Ga_{1-x}Mn_x)N$) [see Applied Physics Letters 86, 032506 (2005)]. This means no heterojunctions need to be grown, which results in a process simplification.

Figure 7:
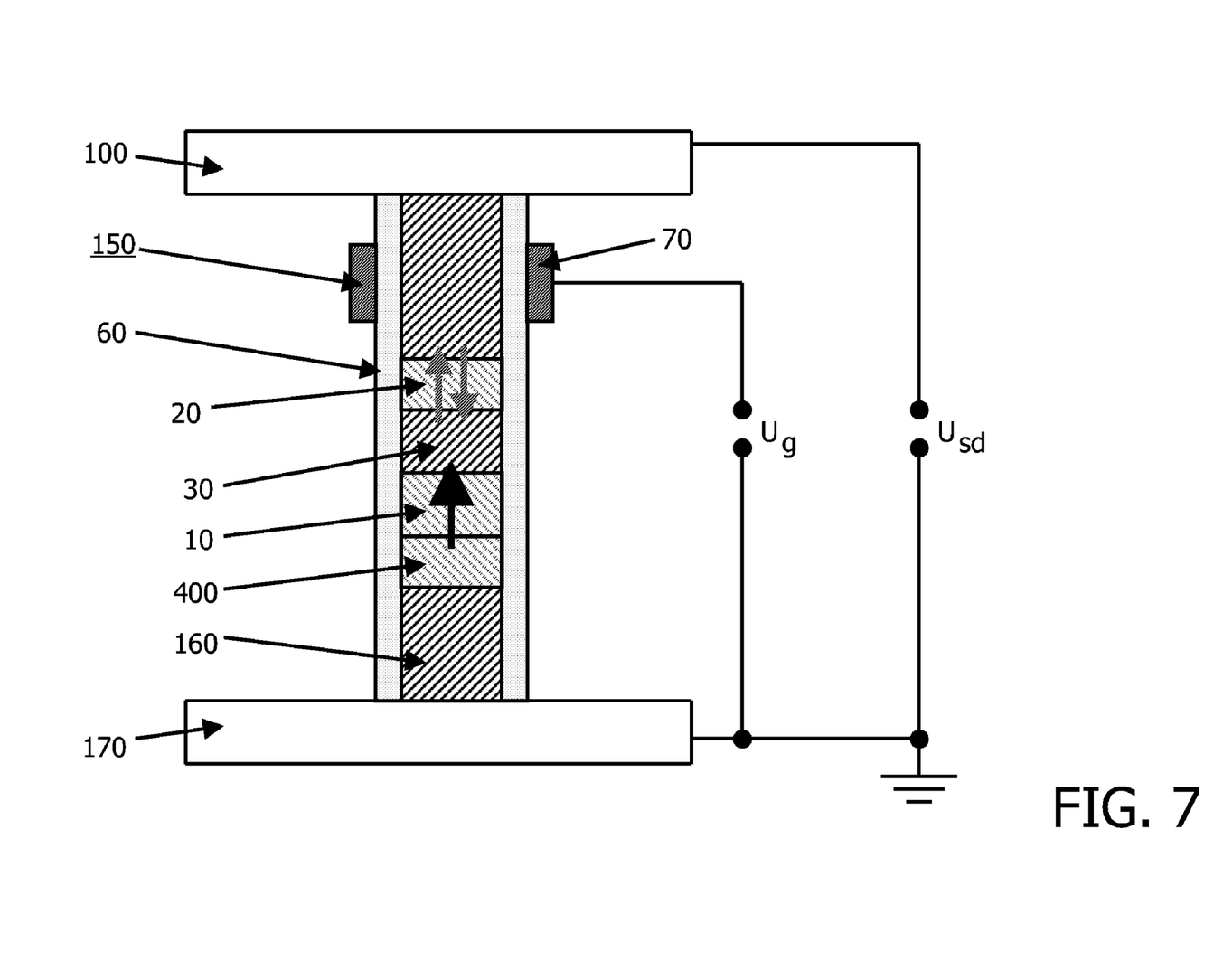
FIG. 7 and FIG. 8 show alternative embodiments to pin the magnetization direction of region 10 of the memory with the selection device shown in FIG. 1.
Figure 8:
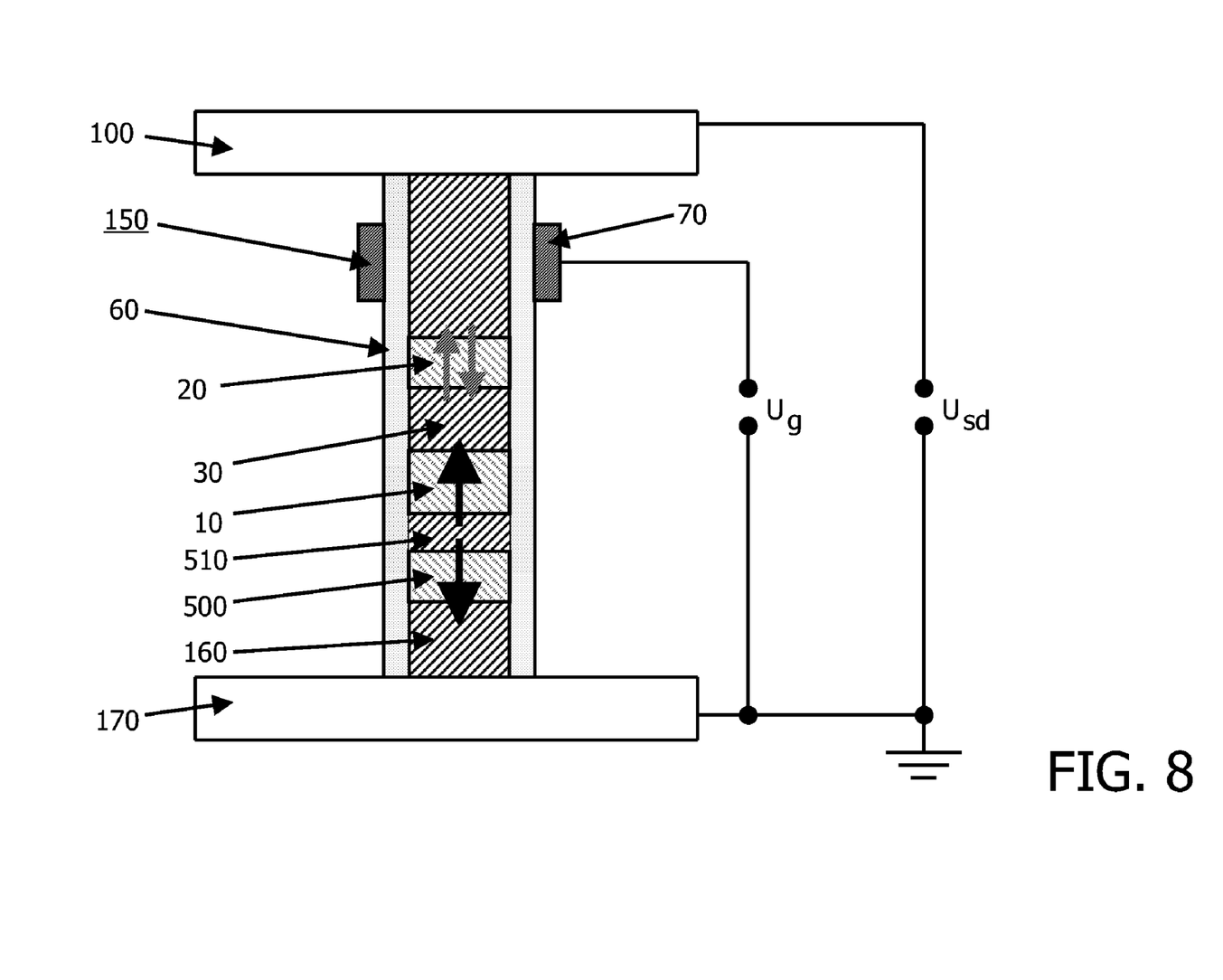

The undiluted SC-NW regions of the columnar structure include a region 160 at the bottom and a spacer layer 30 between the two magnetic layers of the columnar structure. These regions and the DMS regions should be n-doped rather than p-doped because the spin of electrons have orders of magnitude longer dephasing times than holes do. It has been shown that the spin of an electron can be carried without dephasing over distances as long as 100 micrometer. On top of the SC-NW a ferromagnetic electrode 100 with a fixed magnetic moment is deposited. The fixing of the magnetic moment can be achieved by either a thick ferromagnetic layer typical with a thickness of 100 nm with a large coercive field Hc in a range of 500-1000 Oe or by pinning of the magnetization direction by an (artificial) "antiferromagnet". The electrical contacts between the SC-NW and both metallic electrodes should be ohmic to prevent additional spin-dependent resistances at the Schottky barriers and to reduce the working voltage. In case of ohmic contacts these spin-dependent resistances are negligible compared to the spin-dependent resistance of the DMS layers. This effect has the same origin as the fundamentals of spin-injection. The DMS regions have two different thicknesses so that the thicker region does not change its magnetization direction. The magnetization direction in the thicker DMS region 10 should be fixed and remain the same. This is achieved by making this region thicker than the region 20; thus in this case the thickness of region 10 must be so thick that the magnetization direction does not change within the expected life-time of the memory device; An alternative pinning is depicted in FIGS. 7 and 8: pinning of the magnetization by an anti-ferromagnet (see FIG. 7) or by an artificial anti-ferromagnet (see FIG. 8).

The separation between these DMS regions should be larger than the interlayer exchange coupling and other magnetic couplings, e.g., the Peel coupling. That means that the magnetization direction of the thinner DMS disk can rotate more freely. This is shown by the double arrows at region 20. Although shown oriented vertically, in principle other orientations are possible. The non-magnetic semiconductor spacer layer 30 thickness should be smaller than the spin-flip length of the charge carriers, i.e., preferably of the electrons, inside this region but thicker than the magnetic couplings between region 20 and 10 to ensure that the magnetization direction of region 20 can be changed freely independent of the magnetization direction of region 10.

The thinner DMS region 20 acts as the memory cell which stores the information by its magnetization direction. The thinner DMS region with a freely changeable magnetization direction should be thick enough to ensure that it keeps the magnetization direction long enough at the operation temperature, e.g., 10 years at room-temperature. This effect is called super-paramagnetism.

A selection device for the magnetic device can be a switch, e.g. for selecting the columnar structure. The selection device is preferably made intragrally with the columnar nano-structure. The switch is provided in this embodiment by a transistor, e.g. a field effect transistor 150, though in principle other types could be used. A channel 50 or gate region of the transistor is formed by the semiconductor nanowire above the free magnetic layer, and below the top electrode. The columnar structure is surrounded by a gate dielectric 60, of an insulating material. The gate electrode 70 surrounds the circumference of the channel in the columnar structure, separated by the gate dielectric. The gate electrode 70 of the integrated access transistor can be fabricated as a wrap-around gate to increase the coupling to the region 50.

The gate dielectric and protection layer of the active device 60 can be $SiO_2$ or $Si_3N_4$ or any other dielectric material. For protection purposes it can be different at the gate electrode and the active device. At the active device it can also be a core-shell structure with a wider band-gap.

The columnar structure has diameters in the range 40-50 nm and a length of a few hundred nanometers.

Figure 2:
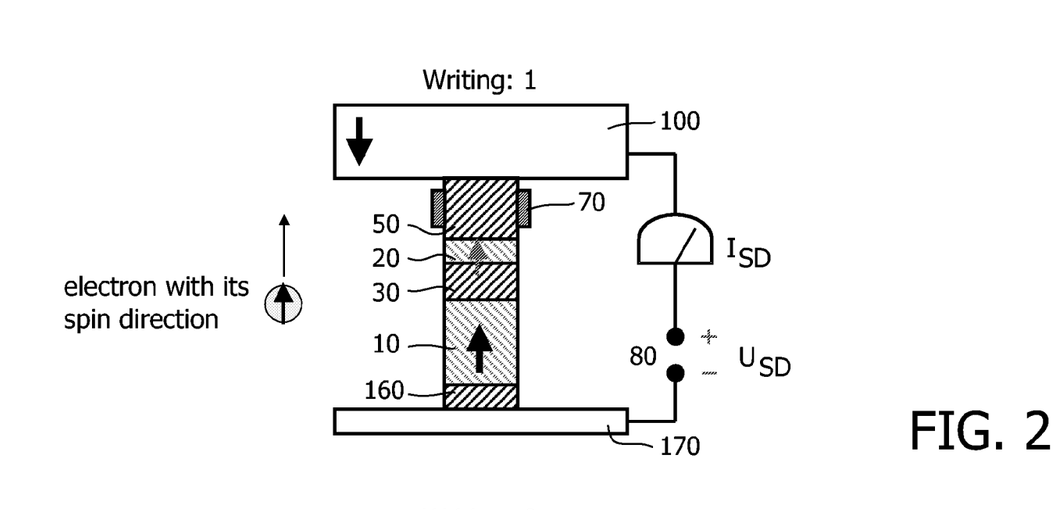
FIGS. 2 to 5 show schematic views of writing and reading processes for a memory according to an embodiment.
Figure 3:
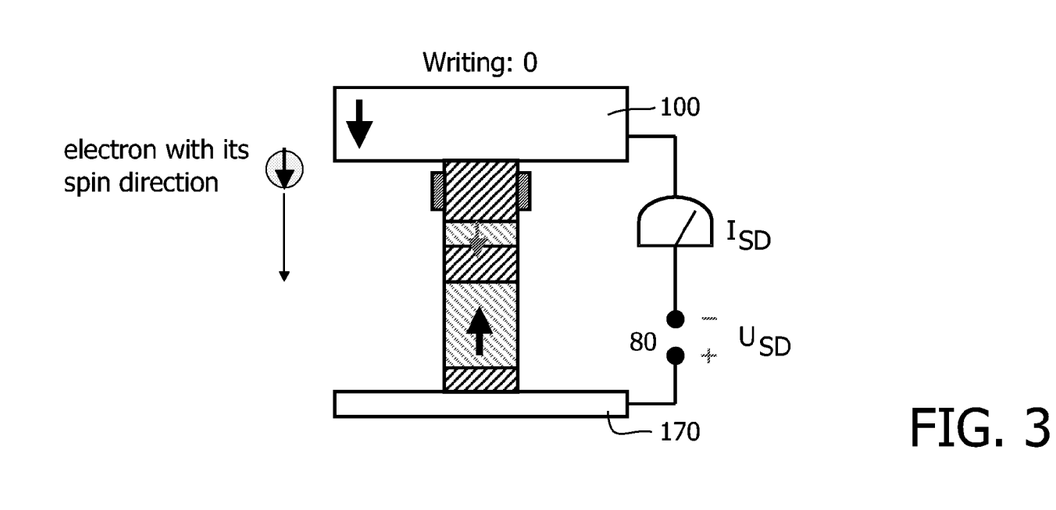

The reading and writing process is shown schematically in FIGS. 2 to 5. Writing information means that the magnetization direction of the thin DMS region is set according to a binary logic value, e.g. logic high or a logic low. FIGS. 2 and 3 show writing a "1" and a "0" respectively, according to the direction of the write current along the columnar structure. The magnetization direction can be reversed by a spin-polarized current with a specific high current density. If the magnetization directions of both regions 20 and 10 are parallel (see FIG. 2) the current is higher than if they are antiparallel as depicted in FIG. 3; the reason of this well-known phenomena is the spin-dependent scattering in region 20.

A power source 80 is provided to supply the writing current. This high current density is difficult to reach in conventional thin film technology but it is already inherent in SC-NW due to the small diameter in the order of a few 10s of nanometers of the columnar structure. Thin round ferromagnetic disks form a single ferromagnetic domain that can be switched within less than 200 picosecond resulting in a writing speed of more than one gigahertz. Furthermore, they have only small stray fields due to the vortex state of the magnetization pattern leading to a good scalability of NW-MRAMs.

Figure 4:
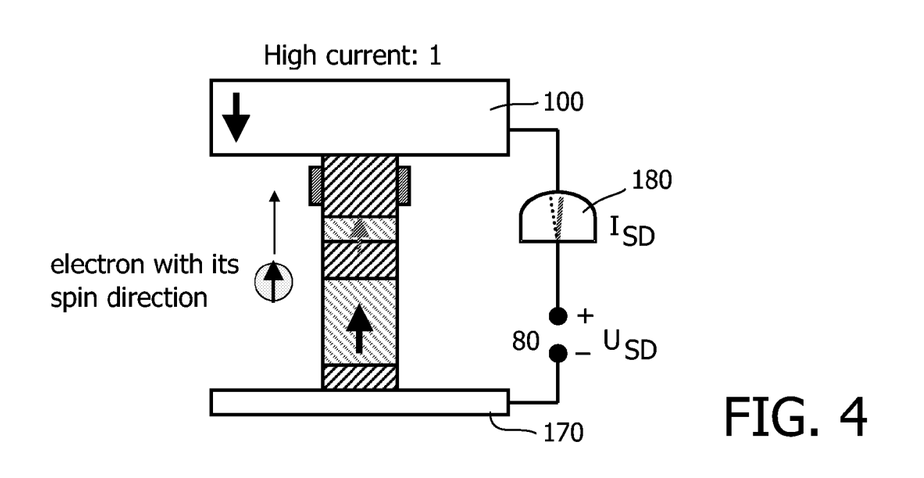
Figure 5:
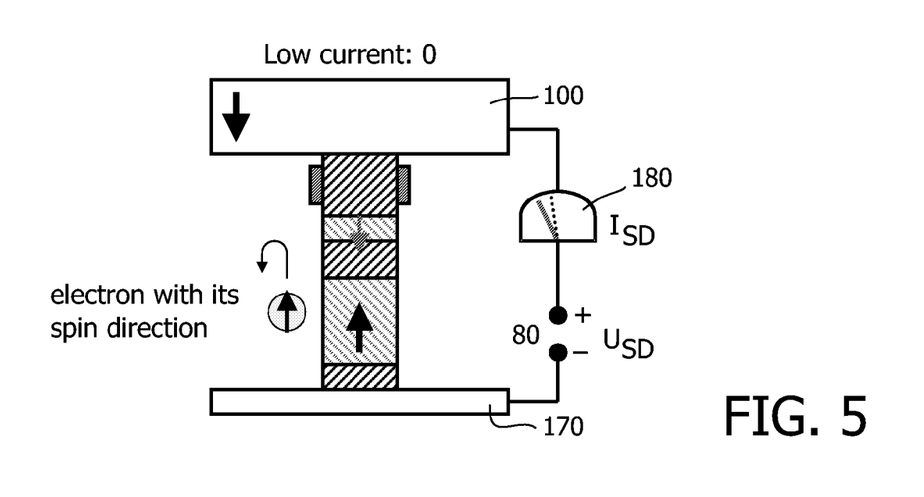

The read-out of the stored information shown in FIGS. 4 and 5 respectively, and is achieved by applying a small voltage (smaller than that used for writing, typical a few mVs) in the direction used for writing a "1", and measuring the flowing current. In FIG. 4, the current detected by current detector 180 coupled across the top and bottom electrodes, is above a first threshold, (shown by a dotted line) indicating a "1" has been read. In FIG. 5, the current is below a second threshold, indicating a "0" has been read. The first and second thresholds can have the same or different values. If both DMS regions have a parallel aligned magnetization direction, the current is higher than in the case of an antiparallel alignment. In the latter case the electron with a specific spin direction relative to the magnetization direction of the thick DMS layer travels from the thick DMS region via the non-magnetic SC-NW to the thin DMS region without losing its spin information, e.g., by spin-flip processes. But the electron will encounter different type of state in the thin DMS region, namely the states for the other spin direction due to the antiparallel aligned magnetization of both DMS regions. Thus most of the electrons will be reflected at the interface resulting in a higher resistance and so a lower current.

To address the memory cell an access field-effect-transistor can be included simply in this approach without the need of an additional area. This means that the access transistor does not limit the scalability. By depositing a gate dielectric between the SC-NW and a metallic gate electrode the electrons in the SC-NW can be depleted by applying a negative gate voltage. By this, the current through the SC-NW will be reduced by several orders of magnitude. Furthermore, the surrounded gate field-effect-transistor is capable of the high switching frequencies in the order of several gigahertz needed to operate the NW-MRAM device.

Figure 6:
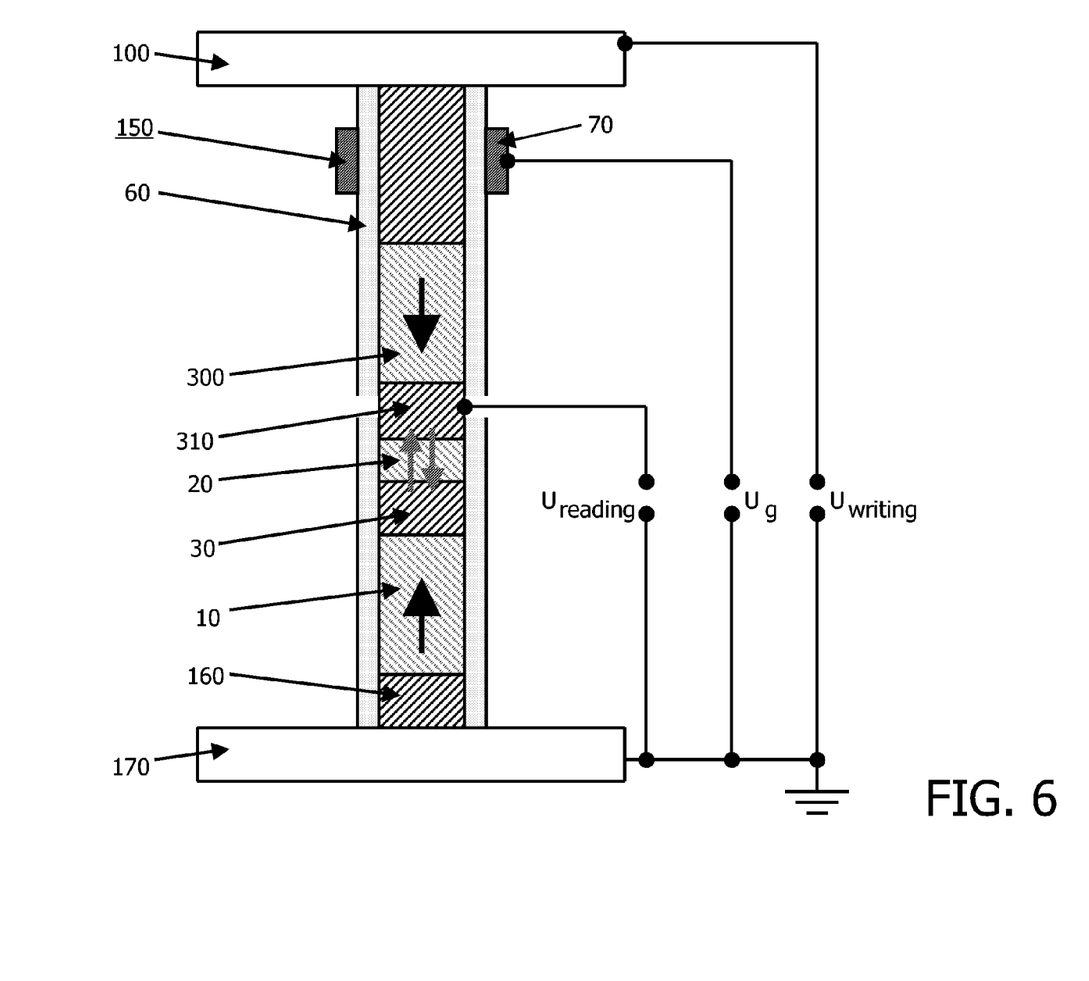
FIG. 6 shows an alternative embodiment (compared to FIG. 1). An electrode connection to an additional spacer layer 310 is added for the reading process in order to be sensitive to the magnetization direction of region 20.

FIG. 6 shows an alternative layer stack of the DMS layers inside the nanowire. There are two DMS regions with fixed magnetization directions 10, 300. The DMS region 20 with the changeable magnetization direction stores the information.

The writing process is not changed (the asymmetry is induced by the direction of the current flow). However due to the symmetry of the layer stack, the reading process has to be changed.

An extra electrode connection was made to the region 310 to be sensitive to the magnetization direction of region 20.

FIG. 7 shows an alternative embodiment where the magnetization direction of region 10 is pinned by an anti-ferromagnet 400 below it; due to the magnetic coupling between the regions 10 and 400 and due to the insensitivity of an anti-ferromagnet from external magnetic fields, the coercitive fields of region 10 is very high compared to region 20.

FIG. 8 shows an alternative embodiment of FIG. 7, where the magnetization direction of region 10 is pinned by an artificial-anti-ferromagnet 500. Regions 10 and 500 are DMS regions. Between both layers 10 and 500 a non-magnetic spacer layer 510 is placed.

Due to the interlayer exchange coupling the magnetization directions in regions 10 and 500 can be aligned antiparallel to each other. The coupling of both ferromagnetic layers is oscillating with increasing spacer thickness 510 between ferromagnetic and anti-ferromagnetic coupling. Moreover, the coupling strength is decreasing with increasing spacer thickness. If the magnetization directions of both DMS regions 10 and 500 are aligned antiparallel they have a higher coercitive field than layer 20.

Figure 9:
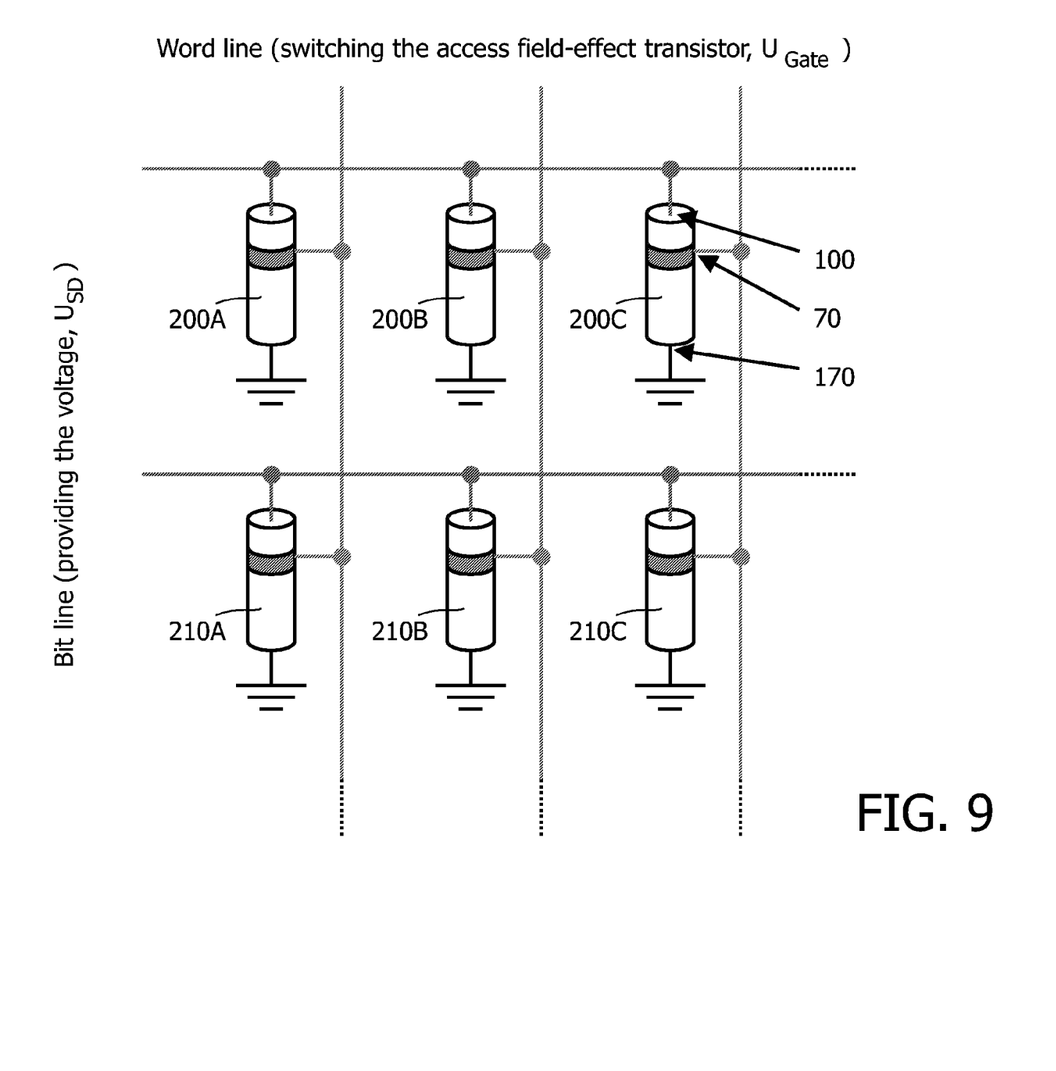
FIG. 9 shows a schematic view of an array of memories according to an embodiment.

A possible way of contacting a single memory cell in an array of NW-MRAMs is shown in FIG. 9, other arrangements can be envisaged. In this Figure, two rows of three devices are shown, there can be many more, e.g. organized in an addressable array. The array can be arranged in rows and columns or in any other topology. For clarity only a Cartesian array will be described. The horizontal rows each have a second select line in the form of a bit line formed by or connected to a top electrode of each of the devices (200A, 200B, 200C) in the row. This corresponds to $U_{source-drain}$ in FIG. 1. The gate electrodes are each connected to (or join to form) different first select lines, in the form of word lines (shown as vertical lines) which correspond to $U_{gate}$ in FIG. 1. So devices 200A and 210A are connected to a first word line, devices 200B and 210B are connected to a second word line, and devices 200C and 210C are connected to a third wordline. The bottom electrodes in this example are all connected to a common ground.

The integrated circuits for the addressing of the memory cells or the amplification of the signals etc. can be placed above or under the active device, i.e., under or above the nanowires. Thus there is no extra space needed for the extra circuitry. Also the packing of different nanowire layers on top of each other is possible since the nanowires do not need a high quality substrate for the growth. Furthermore, the substrate can be silicon but in principle any other material, i.e., even amorphous materials. This allows for a larger flexibility in designing the magnetic device.

Figure 10:
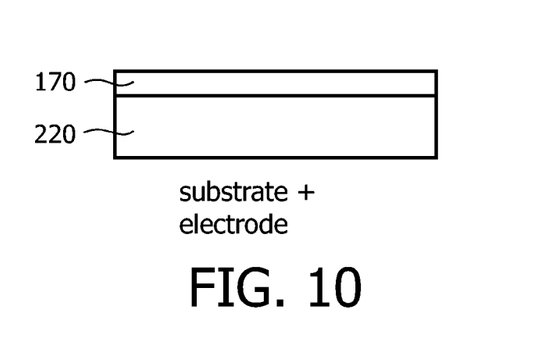
FIGS. 10 to 15 show steps in a manufacturing process according to an embodiment.
Figure 11:
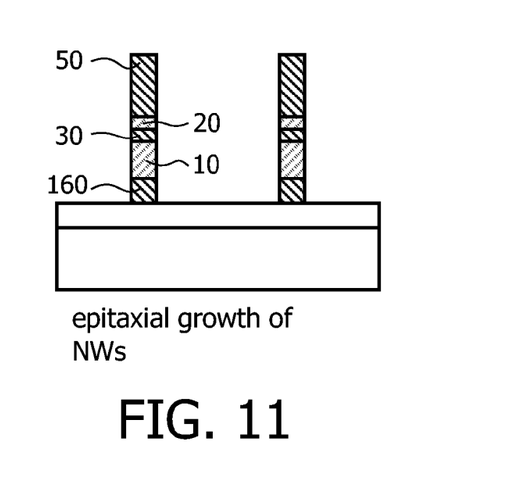
Figure 12:
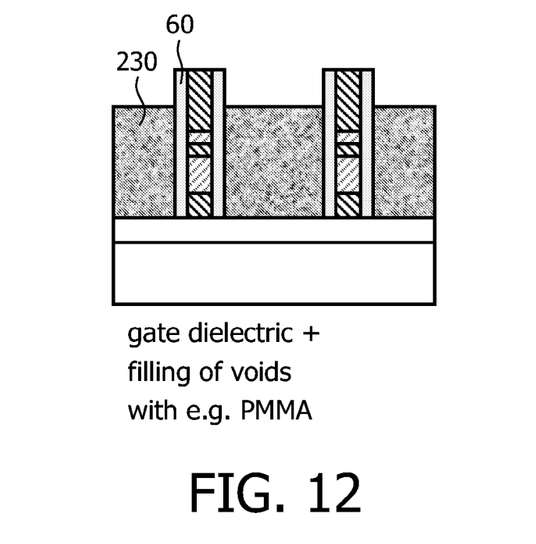

FIGS. 10 to 15 show in cross sectional views, some of the principal steps in a method of manufacturing a device according to an embodiment. In FIG. 10, the bottom electrode 170 is formed on a substrate 220. In FIG. 11, a number of the columnar structures in the form of nanowires described above are grown epitaxially and perpendicularly on the common bottom electrode. In FIG. 12, the sides of the columnar structures are covered by a gate dielectric material 60, and a filler 230 is formed in between the columnar structures.

Figure 13:
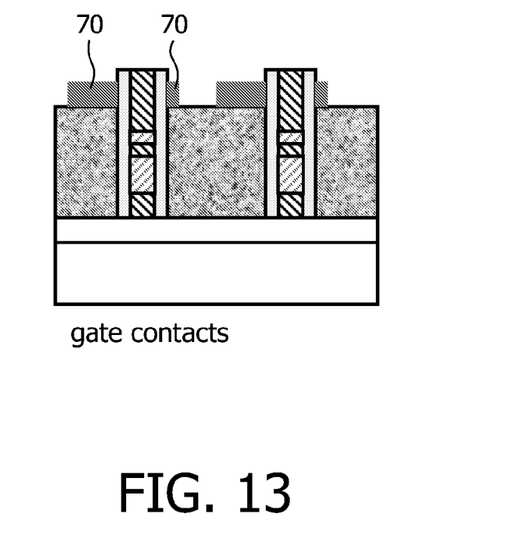
Figure 14:
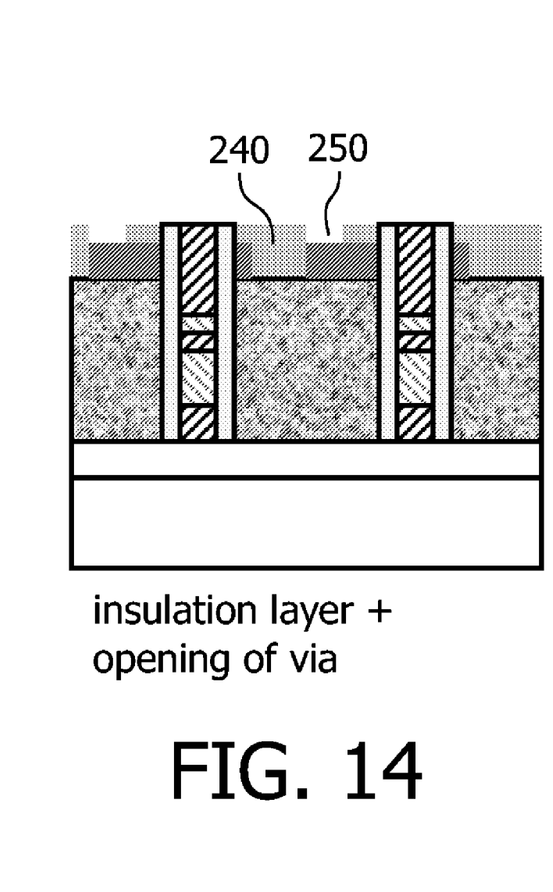
Figure 15:
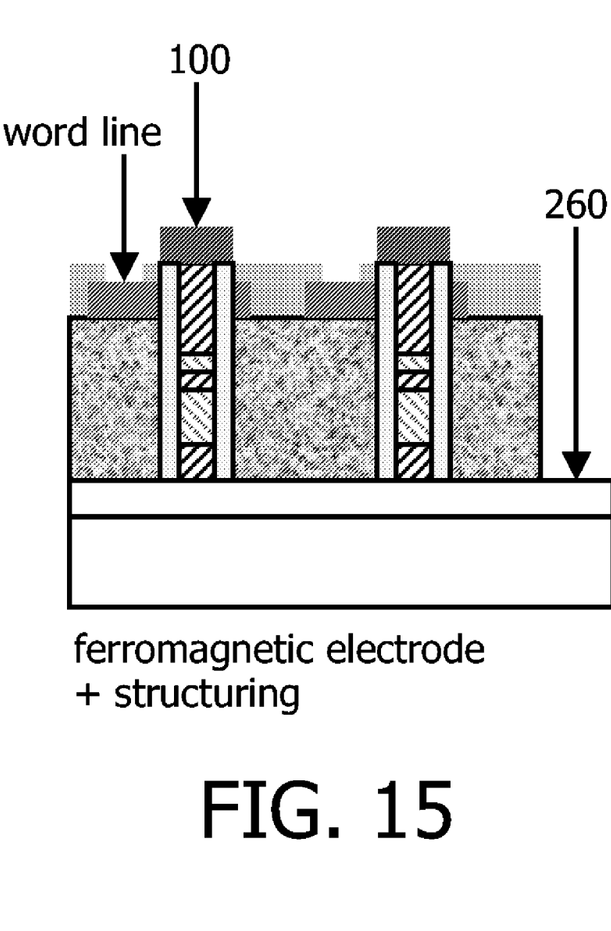

In FIG. 13, the gate electrodes 70 are formed around each columnar structure. In FIG. 14, an insulation layer is formed on top of the gate electrodes, and openings 250 are formed in the insulation layer to enable contact with the gate electrodes. The tops of the columnar structures are left exposed. In FIG. 15, the first select lines in the form of word lines are formed of a conductor, so as to fill the openings 250 and couple the gate electrodes. The top electrodes 100 of a ferromagnetic material are made on top of the columnar structures so as to form bit lines. Also, the ground connection to the bottom electrode is completed.

The present invention includes within its scope various modifications and alternatives. An antiferromagnetic stabilized magnetic area can be introduced in the nanowire, following known principles. This could be another layer using a different material if no antiferromagnetic DMS can be found. The bottom electrode could be the ferromagnetic electrode, instead of the top electrode. The two DMS layers would need to be swapped in this case. The transistor can be located at the bottom of the columnar structure rather than the top, regardless of other layers. The nanowire can be hollow in some or all parts to form a nanotube, which could be useful to reduce stray fields from the currents, particularly from the magnetic regions. One DMS region could be used rather than the two shown. In this case, the bottom electrode should also be ferromagnetic with an antiparallel aligned magnetic moment, compared to that of the top electrode. One of the two contacts with electrodes should be ohmic and the other be a Schottky barrier to create an asymmetry for the reading process. Other growth methods than VLS can be used.

Applications for embodiments of this NW-MRAM can include the large market of computer base memory, memories for mobile phones, and PDAs. Due to the high memory density, NW-MRAMs have the capability to replace even hard disks in computers resulting in a tremendous increase of computation speed. If in the future spintronics or magnetoelectronics become widely used, this NW-MRAM can be suitable for implementation in spintronic devices since it is a purely spintronic device, i.e., all information processing is based merely on the spin of the electron and its charge is only needed to steer the information flow. Of particular interest is the applicability as non-volatile and low power consuming memory in mobile phones with a high memory density. Other variations and applications within the claims can be envisaged by those skilled in the art.

The invention claimed is:

1. A magnetic device comprising:
    at least one nanotube forming a columnar structure including
        a first magnetic layer with a fixed magnetization direction;
        a free magnetic layer with a changeable magnetization direction; and
        a spacer layer separating the first magnetic layer and the free magnetic layer; and
    a selection device for selecting the magnetic device, at least part of the selection device being part of the columnar structure.

2. The magnetic device of claim 1 wherein at least two of the magnetic layers comprise diluted magnetic semiconductor material of one of the at least one nanotube having dopants that respectively form the at least two magnetic layers.

3. The magnetic device of claim 1, the selection device comprising a switch.

4. The magnetic device of claim 3, wherein the switch is a transistor.

5. The magnetic device of claim 4, wherein the at least part of the selection device comprises a channel of a transistor.

6. The magnetic device of claim 5, having a gate electrode around the channel and separated from the channel by a gate dielectric.

7. The magnetic device of claim 1, the at least part of the selection device being located at one end of the columnar structure.

8. The magnetic device of claim 1, having a gate dielectric layer surrounding the columnar structure.

9. The magnetic device of claim 1, the free magnetic layer being thinner than the first magnetic layer.

10. The magnetic device of claim 1, the thickness of the spacer layer being arranged such that the free magnetic layer is within a spin flip length of majority carriers of the first magnetic layer.

11. The magnetic device of claim 1, the columnar structure comprising n-type dopant atoms.

12. The magnetic device of claim 1, having a second magnetic layer with a fixed magnetization direction in a different direction to that of the first magnetic layer.

13. The magnetic device of claim 1, arranged as a memory and having circuitry arranged to couple a current along the columnar structure with sufficient spin polarized current density to alter the direction of magnetization of the free magnetic layer.

14. The magnetic device of claim 1, arranged as a memory and having circuitry to couple a current along the columnar structure in a forward or reverse direction for writing the memory with a value according to the direction of the current.

15. The magnetic device of claim 1, at least part of the columnar structure being tubular.

16. An integrated memory array having a substrate and an array of the magnetic devices of claim 1, the columnar structure in each magnetic device being arranged perpendicular to the substrate.

17. The array of claim 16, having a first select line coupling the switches of the devices in a row of the array, and a second select line for coupling a top or bottom of the columnar structure of magnetic devices in different rows.

18. The magnetic device of claim 1, the respective layers and a channel region of the selection device being part of a nanotube that forms a semiconducting nanowire extending along a length of the columnar structure and having doped regions that respectively form the channel region and the magnetic layers.

19. The magnetic device of claim 1, wherein junctions in the columnar structure with each of the first magnetic layer, the free magnetic layer and the spacer layer are homogeneous regions of the at least one nanotube.

20. The magnetic device of claim 1, wherein junctions in the columnar structure with each of the first magnetic layer, the free magnetic layer and the spacer layer are devoid of heterogeneous regions.

21. The magnetic device of claim 1, wherein at least two of the first magnetic layer, free magnetic layer, spacer layer and selection device include regions that
- are immediately adjacent one another, and
- include nanotubes that form part of both of the immediately adjacent regions.

22. The magnetic device of claim 1, wherein the selection device includes
- a channel region in the at least one nanotube between the free magnetic layer and an electrode,
- a dielectric material on the channel region, and
- a gate separated from the channel region by the dielectric material and configured to apply a bias to the channel region to switch the channel region between conductive states for connecting the free magnetic layer to the electrode.

23. A magnetic memory device comprising:
- a column of semiconducting nanowires connected between upper and lower electrodes, the column including
  - over the lower electrode, a fixed magnetic layer having a fixed magnetization direction,
  - a free magnetic layer over the fixed magnetic layer and having a magnetization direction that is changeable between the fixed magnetization direction and an opposite magnetization direction that is opposite the fixed magnetization direction, the respective magnetization directions corresponding to logic states,
  - a spacer layer that separates the fixed and free magnetic layers,
  - a channel region that connects the free magnetic layer with the upper electrode;
- a switch having a gate separated from the channel region by a dielectric material and configured to connect the free magnetic layer to the upper electrode for read and write operations by switching the channel region between conductive states;
- a write circuit configured to set the magnetization direction of the free magnetic layer to the fixed magnetization direction by applying a high voltage write current across the electrodes in the fixed magnetization direction, and to set the magnetization direction of the free magnetic layer to the opposite magnetization direction by applying a high voltage write current across the electrodes in a direction that is opposite the fixed magnetization direction; and
- a read circuit configured to apply a low read voltage across the electrodes, the column being responsive to the low read voltage by passing a high current level when the free magnetic layer has the fixed magnetization direction, and by passing a low current level when the free magnetic layer has the opposite magnetization direction.

* * * * *